United States Patent [19]

Maeguchi

[11] Patent Number: 4,463,492
[45] Date of Patent: Aug. 7, 1984

[54] METHOD OF FORMING A SEMICONDUCTOR DEVICE ON INSULATING SUBSTRATE BY SELECTIVE AMORPHOSIZATION FOLLOWED BY SIMULTANEOUS ACTIVATION AND RECONVERSION TO SINGLE CRYSTAL STATE

[75] Inventor: Kenji Maeguchi, Yokohama, Japan

[73] Assignee: Tokyo Shibaura Denki Kabushiki Kaisha, Japan

[21] Appl. No.: 423,146

[22] Filed: Sep. 24, 1982

[30] Foreign Application Priority Data

Sep. 30, 1981 [JP] Japan ................................ 56-155185

[51] Int. Cl.³ .................. H01L 21/263; H01L 21/225
[52] U.S. Cl. ..................................... 29/576 B; 29/571; 29/576 T; 148/1.5; 148/187; 357/91; 427/53.1
[58] Field of Search ................. 29/576 B, 571, 576 T; 148/1.5, 187; 357/91; 427/53.1

[56] References Cited

U.S. PATENT DOCUMENTS

| | | | |
|---|---|---|---|
| 4,240,843 | 12/1980 | Celler et al. | 148/1.5 |
| 4,338,616 | 7/1982 | Bol | 357/15 |
| 4,379,727 | 4/1983 | Hansen et al. | 148/1.5 |
| 4,385,937 | 3/1983 | Ohmura | 148/1.5 |
| 4,391,651 | 7/1983 | Yoder | 148/1.5 |

OTHER PUBLICATIONS

Csepregi et al., J. Appl. Phys., 49, (1978), 3906.
Lüthy et al., Appl. Phys. Letts., 35, (1979), 873.
Roulet et al., J. Appl. Phys., 50, (1979), 5536.
Fang et al., IBM-TDB, 23, (1980), p. 362.
Koyanagi et al., Appl. Phys. Letts., 35, (1979), 621.
Fowler et al., IBM-TDB, 24, (1981), 1090.
Phys. Stat. Solidi, 499, (1978), 405.
T. Yoshii et al., "Improvement of SOS Device Performance by Solid-Phase Epitaxy," Digest of Tech. Papers 13th Conference on Solid State Devices, pp. 79-80, (1981).

*Primary Examiner*—Upendra Roy
*Attorney, Agent, or Firm*—Finnegan, Henderson, Farabow, Garrett & Dunner

[57] ABSTRACT

A method for manufacturing a semiconductor device of a type in which a semiconductor element is formed on an insulating substrate. After ions which break the regularity of the crystal lattice of a monocrystalline semiconductor layer formed on the insulating substrate are implanted to form an amorphous semiconductor layer in part of the monocrystalline semiconductor layer, and after an impurity is doped in the semiconductor layer, a single annealing process is performed to recrystallize the amorphous semiconductor layer and at the same time to activate the doped impurity.

13 Claims, 11 Drawing Figures

F I G. 4
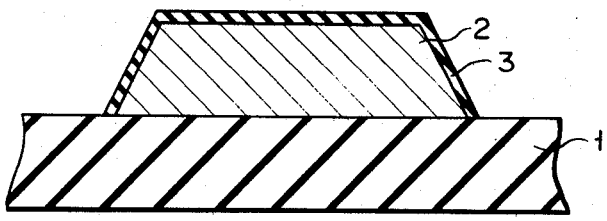
F I G. 5
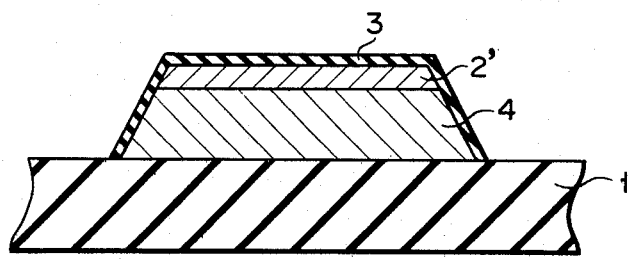
F I G. 6
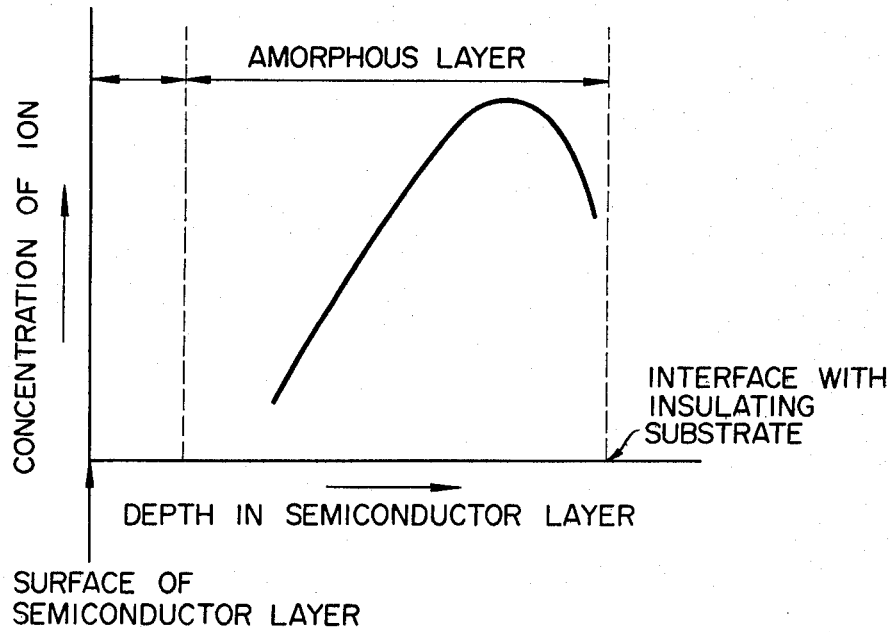

METHOD OF FORMING A SEMICONDUCTOR DEVICE ON INSULATING SUBSTRATE BY SELECTIVE AMORPHOSIZATION FOLLOWED BY SIMULTANEOUS ACTIVATION AND RECONVERSION TO SINGLE CRYSTAL STATE

BACKGROUND OF THE INVENTION

I. Field of the Invention

The present invention relates to a method for manufacturing a semiconductor device which has an element in its semiconductor layer on an insulating substrate.

II. Description of the Prior Art

A semiconductor device of a type in which a semiconductor element is formed on an insulating substrate, for example, an SOS (silicon on sapphire) semiconductor device is recently receiving attention due to its high speed operation and low power consumption.

The thermal expansion factor of the insulating substrate (e.g., sapphire substrate) is generally different from that of the semiconductor layer (e.g., silicon layer). Therefore, compressive stress due to heat occurs in the semiconductor layer on the insulating substrate. The lattice defect of a relatively high density occurs in the vicinity of the interface between the insulating substrate and the semiconductor layer due to this compressive stress and the difference of the crystalline structure between silicon and sapphire. The compressive stress and the lattice defect adversely affect the electrical characteristics of the semiconductor device. For example, in a metal oxide semiconductor (MOS) device which is one of the semiconductor devices of the type in which a semiconductor element is formed on the insulating substrate, the effective carrier mobility is degraded, the threshold voltage varies, and the leakage current increases.

In order to eliminate the above drawbacks, the following process has been adopted. $Si^+$ ions of a high concentration are implanted into a monocrystalline silicon layer to form an amorphous layer in the vicinity of the interface between silicon and sapphire. The structure is then annealed at a temperature higher than about 600° C., so that the solid phase growth occurs using the silicon surface layer remaining as monocrystalline silicon without being converted to amorphous silicon as a seed crystal. Thus, the amorphous layer is recrystallized. The density of the lattice defect of the silicon surface layer is low. When this layer is used as the seed crystal to recrystallize the amorphous layer formed near the interface between silicon and sapphire by the solid phase growth, the amorphous layer is converted to monocrystalline silicon layer which has less lattice defects. When the solid phase growth is performed at a relatively low temperature of, for example, less than 900° C., the compressive stress in the silicon layer is also decreased.

In the conventional process for manufacturing MOS devices, the above process is first performed. The amorphous semiconductor layer on the insulating substrate is converted to the monocrystalline semiconductor layer which has less lattice defects, and then the MOS device is manufactured. However, the process for manufacturing the device includes an annealing step at a temperature of higher than 900° C. such as annealing of a doped impurity and $POCl_3$ treatment of the insulating interlayer. The compressive stress in the semiconductor layer which is decreased by the solid phase growth process is increased again, resulting in inconvenience.

In the current process for manufacturing a semiconductor device, a relatively high temperature is necessary for activating an impurity when the impurity is doped in the monocrystalline semiconductor layer. When the impurity-activating temperature is high, the source and drain regions in the semiconductor layer are widened, thus adversely affecting micronization of the element.

SUMMARY OF THE INVENTION

It is, therefore, the object of the present invention to provide a method for manufacturing a semiconductor device, wherein a temperature for activating an impurity doped in a semiconductor layer can be lowered.

It is another object of the present invention to provide a method for manufacturing a semiconductor device which has a monocrystalline semiconductor layer which is formed on an insulating substrate and has a low lattice defect density.

It is still another object of the present invention to provide a method for manufacturing a semiconductor device which has a monocrystalline semiconductor layer having a small compressive stress on an insulating substrate.

According to the method of the present invention, the solid phase growth process and activation of the impurity doped in the semiconductor layer are conducted in a single annealing process. That is, this invention provides a method for manufacturing a semiconductor device, comprising the steps of:

forming a monocrystalline semiconductor layer on an insulating substrate;

implanting ions for breaking the regularity of the crystal lattice of said monocrystalline semiconductor layer into said monocrystalline semiconductor layer to form an amorphous layer in part of said monocrystalline semiconductor layer along a direction of thickness thereof;

doping an impurity in said amorphous layer and a remaining portion of said monocrystalline semiconductor layer; and annealing the structure thus obtained, whereby activation of said impurity and recrystallization of said amorphous layer by solid phase growth using said remaining portion of said monocrystalline semiconductor layer as a seed crystal are simultaneously performed.

According to the method of the present invention, the impurity is mainly doped in the amorphous layer and is activated when the amorphous layer is recrystallized, thus requiring a low activating temperature. This is because the atoms of the amorphous semiconductor which is being recrystallized are readily substituted by the impurity atoms as compared with the atoms of the monocrystalline semiconductor. Thus, since the impurity can be activated at a low temperature in the method of the present invention, the expansion (especially in the lateral direction) of the source and drain regions is restricted. As a result, the micronization of the element can be attained.

Furthermore, according to the method of the present invention, the solid phase growth and the activation of the doped impurity are conducted in a single annealing step. Therefore, unlike the conventional method, the compressive stress of the semiconductor layer which is decreased in the solid phase growth process may not be increased again in the subsequent impurity activating process. As a result, a semiconductor device is prepared which has a monocrystalline semiconductor layer whose compressive stress is decreased.

According to the method of the present invention, when solid phase growth is performed using the surface portion of the monocrystalline semiconductor layer which has a low lattice defect density as a seed crystal, a semiconductor device is prepared which has a monocrystalline semiconductor layer whose lattice defect density is small. As a result, the electrical characteristics of the semiconductor device are greatly improved.

BRIEF DESCRIPTION OF THE DRAWINGS

FIGS. 1 to 5, FIG. 7 and FIGS. 9 to 11 are sectional views for explaining the preferred embodiments of the method of the present invention; and FIGS. 6 and 8 are graphs for explaining the concentration of the ions doped in a semiconductor layer as a function of the depth in the semiconductor layer.

DETAILED DESCRIPTION OF THE PREFERRED EMBODIMENTS

A preferred embodiment of the invention will be described with reference to the accompanying drawings, in which a method for manufacturing a semiconductor device is applied to the manufacture of an n-channel MOS device.

Figure 1:

Referring to FIG. 1, an insulating substrate 1 made of sapphire is prepared. Instead of sapphire, spinel or silicon dioxide may be used as a material of insulating substrate 1. A multilayer structure may be used as an insulating substrate in which a semiconductor layer is sandwiched between first and second insulating layers. The thickness of the insulating substrate 1 is, for example, about 500 μm.

Figure 2:
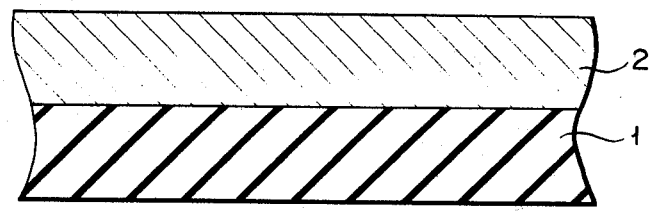

A monocrystalline semiconductor layer 2 is formed by, for example, the well known epitaxial growth method, on the insulating substrate 1, as shown in FIG. 2. The typical semiconductor material is silicon. The thickness of the monocrystalline semiconductor layer 2 is generally 0.1 to 0.8 μm.

Figure 3:
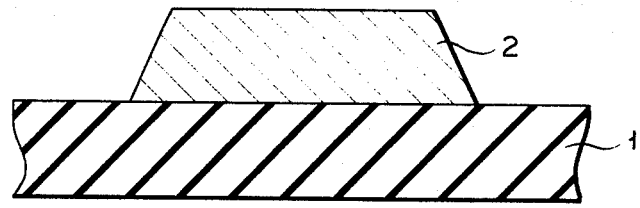

As shown in FIG. 3, the monocrystalline semiconductor layer 2 is patterned by, for example, the well known photoetching technique to form an island semiconductor region.

As shown in FIG. 4, the monocrystalline semiconductor layer 2 is thermally oxidized in an atmosphere of oxygen at a high temperature of higher than 900° C. to form an oxide layer 3. The thickness of the oxide layer 3 is, for example, about 50 nm. The oxide layer 3 will finally function as a gate oxide film of the device.

As shown in FIG. 5, ions for breaking the regularity of the crystal lattice of the monocrystalline semiconductor layer 2 are implanted through the oxide layer 3 to form an amorphous layer 4 in part of the monocrystalline semiconductor layer 2 along the direction of the thickness thereof. If the monocrystalline semiconductor is silicon, ions for forming the amorphous layer are preferably $Si^+$ ions. As shown in FIG. 5, the amorphous layer 4 is preferably formed in a portion except for the surface portion of the monocrystalline semiconductor layer 2 due to the following reason. The lattice defect density is high in the vicinity of the interface between the monocrystalline semiconductor layer 2 and the insulating substrate 1. However, the lattice defect density is low in the surface portion of the monocrystalline semiconductor layer 2. Therefore, in a preferred mode of the invention, the semiconductor portion in the vicinity of the interface between the insulating substrate 1 and the monocrystalline semiconductor layer 2, which has a high lattice defect density, is formed into amorphous semiconductor, whereas the surface portion of the monocrystalline semiconductor layer which has a low lattice defect density is used as a seed crystal to perform solid phase growth. Thus, the monocrystalline semiconductor layer is obtained which has a low lattice defect density.

On the other hand, when the surface portion of the monocrystalline semiconductor layer 2 is formed into an amorphous semiconductor, the lattice defect density may not be decreased since the solid phase growth process is performed using the semiconductor of high lattice density in the vicinity of the interface as the seed crystal. Even in this case, a great advantage is brought about that the activation of the impurity doped in the semiconductor layer in the subsequent process can be performed at a low temperature. Thus, the formation of the amorphous layer 4 in the surface portion of the monocrystalline semiconductor layer 2 is included in the spirit and scope of the present invention. The thickness of the amorphous layer 4 is preferably great, that is, more than about 50% of the thickness of the monocrystalline semiconductor layer 2. When the amorphous layer formation ions are $Si^+$ ions, an acceleration voltage is, for example, 100 to 200 KeV and a dose is, for example, $5 \times 10^{14}$ to $5 \times 10^{15}$ ions/cm².

Next, an impurity for forming a p-type impurity region, such as $B^+$ ions are ion-implanted to have a concentration peak in the amorphous layer 4 in the vicinity of the interface between the monocrystalline semiconductor layer 2 and the insulating substrate 1. The above step is conventionally performed to prevent the so called back channel phenomenon (in the conventional process, however, an impurity is ion-implanted in a monocrystalline semiconductor layer in place of the amorphous layer). According to the back channel phenomenon, a positive charge often occurs in the vicinity of the interface between the monocrystalline semiconductor layer and the insulating substrate (e.g., sapphire). A negative charge occurs in the semiconductor portion in the vicinity of the interface in correspondence with the positive charge, so that an n-channel is turned on, thus causing the back channel phenomenon. In order to prevent generation of the negative charge, a p-type impurity of a high concentration is ion-implanted to have the concentration peak in the vicinity of the interface. If the doped ions are $B^+$ ions, the acceleration voltage is, for example, about 100 keV, and a dose is, for example, about $4 \times 10^{12}$ ions/cm². FIG. 6 shows the concentration profile of the doped ions.

Figure 7:
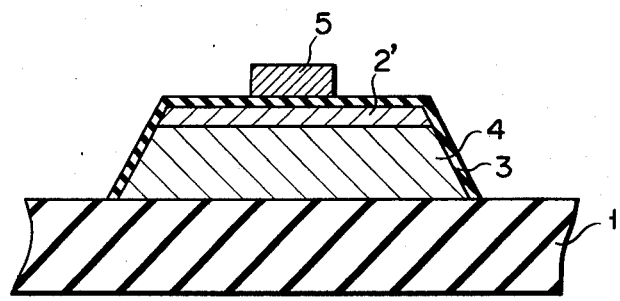

As shown in FIG. 7, a gate electrode 5 is then formed on the oxide layer 3. The gate electrode 5 may be formed by, for example, depositing an impurity-doped polycrystalline silicon film by the well known chemical vapor deposition (CVD) at a temperature of about 550° C. to cover the entire surface of the oxide layer 3 and patterning it by photoetching. The thickness of the gate electrode 5 is, for example, about 0.4 μm.

Figure 8:
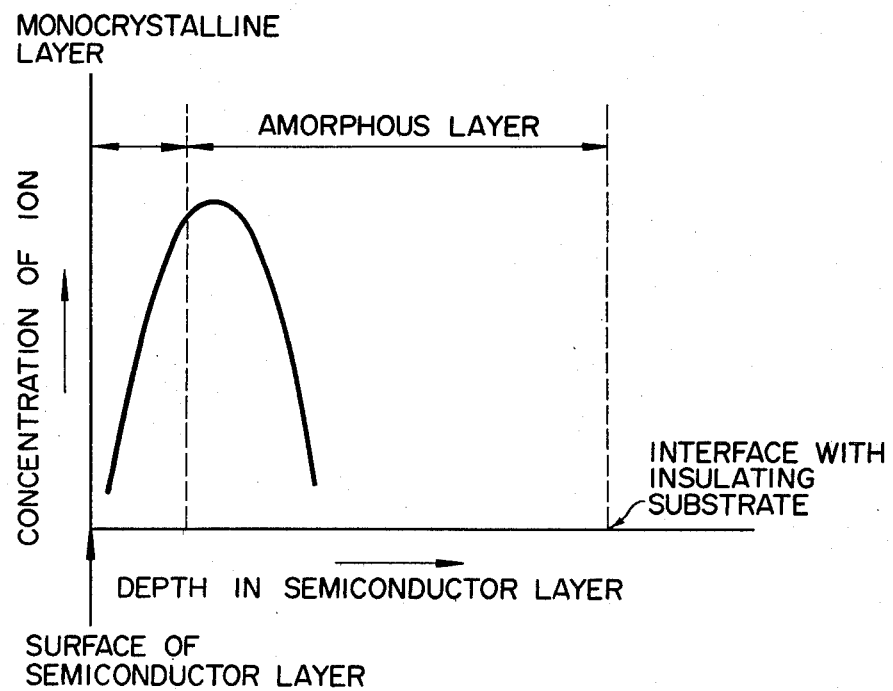

An n-type impurity such as arsenic is ion-implanted in the amorphous layer 4 and a remaining monocrystalline semiconductor layer 2' using the gate electrode 5 as a mask. The ion implantation of the impurity aims at forming the source and drain regions of the semiconductor device in the subsequent process. In this case, part of the impurity is introduced in the amorphous layer 4. FIG. 8 shows the concentration distribution of the impurity. If the impurity to be implanted is $As^+$ ions, an acceleration voltage is 20 to 100 KeV, and the dose is $1 \times 10^{15}$ to $5 \times 10^{15}$ ions/cm$^2$.

Figure 9:
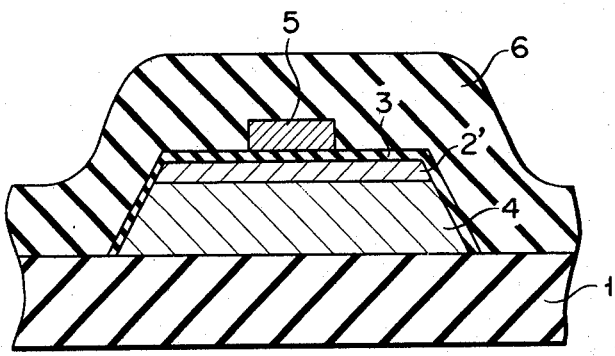

As shown in FIG. 9, an insulating film 6 is formed to cover the entire surface of the structure. The insulating film 6 is made of, for example, silicon dioxide which is formed by the chemical vapor deposition method at a temperature of about 550° C.

Figure 10:
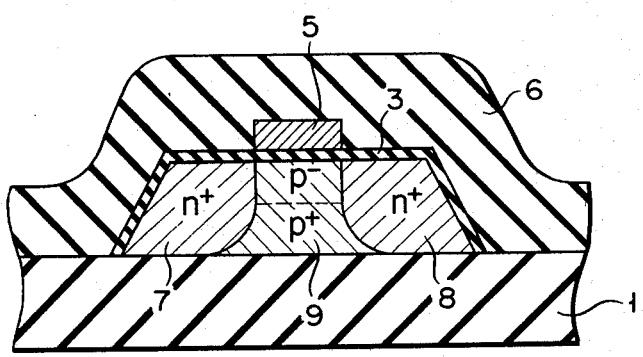

The structure is then annealed. Solid phase growth is performed using the remaining monocrystalline semiconductor layer 2' as the seed crystal to recrystallize the amorphous layer 4. At the same time, the impurity doped in the amorphous layer 4 and in the remaining monocrystalline semiconductor layer 2' is activated. According to the method of the present invention, recrystallization of the amorphous layer 4 and activation of the impurity are simultaneously performed by a single annealing step, which is the principal feature of the present invention. Thirty minutes' annealing is enough and the temperature of annealing is preferably 700° to 1,000° C. As shown in FIG. 10, by the annealing, n-type source and drain regions 7 and 8 and a p-type channel region 9 sandwiched therebetween are formed. Since the p-type impurity is ion-implanted deep in the monocrystalline semiconductor layer 2, the shallower portion of the channel region 9 is a p$^-$-type portion having a low concentration of impurity, while the deeper portion thereof is a p$^+$-type portion having a high concentration of impurity.

As described above, most or part of the impurity is doped in the amorphous layer 4. Therefore, activation of the impurity is performed mainly in the amorphous layer 4. The atoms of the amorphous semiconductor are easily substituted by the impurity atoms as compared with the atoms of the monocrystalline semiconductor. Therefore, the impurity in the amorphous layer can be activated at a lower temperature than that of the impurity in the monocrystalline semiconductor layer. Thus, the small impurity regions (source and drain regions) can be formed, resulting in micronization of the element.

The diffusion rate of the impurity in the amorphous semiconductor layer is higher than that in the monocrystalline semiconductor layer. Therefore, even if the impurity is activated at a low temperature, the deep source and drain regions 7 and 8 which reach the insulating substrate 1 can be formed. As a result, the parasitic junction capacitance between the source and drain regions is decreased, thus providing a high-speed semiconductor element.

The effect is more pronounced when arsenic is used as an impurity to form the source and drain regions. The diffusion rate of arsenic in the monocrystalline semiconductor layer is slow. Therefore, when arsenic is activated in the monocrystalline semiconductor layer, the deep source and drain regions can hardly be formed. However, according to the method of the present invention, arsenic is mainly activated in the amorphous layer. Therefore, even if an impurity such as arsenic is used which has a low diffusion rate, the deep source and drain regions can be formed. Furthermore, according to a preferred embodiment of the present invention, the remaining monocrystalline semiconductor layer 2' is present in the upper portion of the semiconductor layer. Arsenic doped in the remaining monocrystalline semiconductor layer 2' can hardly be diffused. Thus, side diffusion, which results in extension of the impurity region to the region under the gate electrode 5, may not occur in the surface portion of the semiconductor layer.

In this manner, when arsenic is used as the impurity in the method of the present invention, the impurity region does not extend under the gate electrode 5, and ideal source and drain regions which reach the insulating substrate 1 can be obtained.

According to the preferred embodiment of the present invention, the amorphous semiconductor layer 4 is recrystallized by solid phase growth using as the seed crystal the monocrystalline semiconductor in the surface portion which has a low lattice defect density. Therefore, the source, drain and channel regions 7, 8 and 9 which have a low lattice defect density can be formed. Thus, the electrical characteristics of the semiconductor element are improved, and the compressive stress of the semiconductor layer is decreased.

Annealing may also function as another heat treatment. For example, in the process for manufacturing the MOS device, the insulating layer 6 is phosphorus-treated in an atmosphere of POCl$_3$ at a temperature of about 900° C. This phosphorus treatment is performed in order to extract ions such as Na$^+$ or K$^+$ ions from the gate electrode 5 into the insulating film 6. When the above step is adopted in the process for manufacturing the device, recrystallization of the amorphous layer 4 and activation of the impurity are simultaneously performed. This is because the phosphorus treatment is performed at a temperature of about 900° C. In other words, the phosphorus treatment of the insulating film 6, recrystallization of the amorphous semiconductor layer 4, and activation of the impurity are performed at once by the single step, resulting in convenience. In the conventional method for manufacturing the MOS device, a phospho-silicate glass (PSG) layer is sometimes formed on the insulating film 6. Thereafter, the glass layer is melted to smoothen the surface, which is called a melting step. If this step is adopted, recrystallization of the amorphous semiconductor layer and activation of the impurity can be simultaneously performed in this step.

Figure 11:
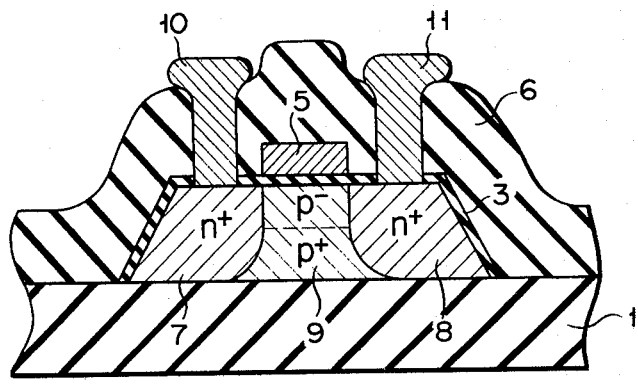

In the same manner as in the conventional process, contact holes are formed by selectively photoetching the oxide layer 3 and the insulating film 6 which cover the source and drain regions 7 and 8. Source and drain electrodes 10 and 11 which are made of, for example, aluminum are deposited to prepare a MOS device as shown in FIG. 11. In particular, after aluminum is vacuum-deposited to cover the entire surface of the structure, it is patterned by photoetching or the like to form the source and drain electrodes 10 and 11.

EXAMPLE

A monocrystalline silicon layer of 0.3 μm thickness was formed by the epitaxial growth method on a sapphire substrate of 530 μm thickness. The silicon layer was patterned by photoetching to form an island silicon region. Annealing was then performed in an atmosphere of oxygen at a high temperature of higher than 900° C. to grow a silicon dioxide film of 50 nm thickness in the surface of the silicon layer.

Si$^+$ ions were then implanted in the monocrystalline silicon layer through the silicon dioxide film at an acceleration voltage of 180 KeV and a dose of $1 \times 10^{15}$ ions/cm$^2$. An amorphous layer of 0.25 μm thickness was formed in the portion of the monocrystalline semiconductor layer except for its surface layer.

B$^+$ ions were then implanted to have the concentration peak in the amorphous semiconductor layer in the vicinity of the interface between the sapphire substrate and the monocrystalline semiconductor layer at an acceleration voltage of 10 KeV and a dose of $4 \times 10^{12}$ ions/cm$^2$.

A phosphorus-doped polycrystalline silicon film was deposited by the chemical vapor deposition method to cover the entire surface of the structure at a temperature of 550° C. and was then patterned by photoetching to form a gate electrode.

Using the gate electrode as a mask, As+ ions were implanted in the semiconductor layer at an acceleration voltage of 60 KeV and a dose of $5 \times 10^{15}$ ions/cm$^2$.

A silicon dioxide film of 0.5 μm thickness was deposited by CVD method to cover the entire surface of the structure at a temperature of 550° C. The structure was then placed in an atmosphere of POCl$_3$ at a temperature of 900° C., so that the silicon dioxide film was treated with phosphorus. In this step, recrystallization of the amorphous semiconductor layer and activation of B+ and As+ ions were simultaneously performed to form n+-type source and drain regions and a channel region which has a p−-type shallower portion and a p+-type deeper portion.

Contact holes were formed in the silicon dioxide films which covered the source and drain regions in accordance with conventional photoetching. Aluminum was then vacuum-deposited to cover the entire surface of the structure and was patterned by photoetching to form source and drain electrodes which respectively contacted the source and drain regions. Thus, an n-channel MOS device is prepared.

The present invention is not limited to the particular embodiment. Various changes, modifications, omissions and additions may be provided within the spirit and scope of the present invention, which is apparent to those who are skilled in the art. For example, a p-channel MOS device and a CMOS device can be manufactured. Furthermore, annealing may be performed by a laser.

What is claimed is:

1. A method for manufacturing a semiconductor device, comprising the steps of:
    forming a monocrystalline semiconductor layer on an insulating substrate;
    implanting ions for breaking the regularity of the crystal lattice of said monocrystalline semiconductor layer into said monocrystalline semiconductor layer to form an amorphous layer in part of said monocrystalline semiconductor layer along a direction of thickness thereof;
    doping an impurity in said amorphous layer and a remaining portion of said monocrystalline semiconductor layer; and
    annealing the structure thus obtained, whereby activation of said first impurity and recrystallization of said amorphous layer by solid phase growth using said remaining portion of said monocrystalline semiconductor layer as a seed crystal are simultaneously performed.

2. The method according to claim 1, wherein said amorphous layer is formed in a portion of said monocrystalline semiconductor layer except for the surface portion thereof.

3. The method according to claim 1, wherein said amorphous semiconductor layer is formed in the surface portion of said monocrystalline semiconductor layer.

4. The method according to claim 1, wherein said impurity is doped by means of ion implantation.

5. The method according to claim 4, wherein said impurity is As+ ions.

6. The method according to one of claims 1 to 5, wherein said annealing is performed at a temperature of 700° to 1,000° C.

7. A method for manufacturing a metal oxide semiconductor device, comprising the steps of:
    forming a monocrystalline semiconductor layer on an insulating substrate;
    forming an oxide layer on said monocrystalline semiconductor layer;
    doping ions for breaking the regularity of the crystal lattice of said monocrystalline semiconductor layer through said oxide layer into said monocrystalline semiconductor layer to form an amorphous semiconductor layer in part of said monocrystalline semiconductor layer along a direction of thickness thereof;
    forming a gate electrode on part of said oxide layer;
    doping a first impurity in said amorphous semiconductor layer and a remaining portion of said monocrystalline semiconductor layer using said gate electrode as a mask;
    annealing the structure thus obtained, whereby activation of said first impurity and recrystallization of said amorphous semiconductor layer by solid phase growth using said remaining portion of said monocrystalline semiconductor layer as a seed crystal are simultaneously performed; and
    selectively removing said oxide layer which contacts an impurity region formed by said activation of said first impurity to expose the impurity region, and forming an electrode which contacts said exposed impurity region.

8. The method according to claim 7, further comprising the step of implanting a second impurity which has a conductivity type opposite to the conductivity type of said first impurity into said amorphous semiconductor layer and said remaining portion of said monocrystalline semiconductor layer, before said gate electrode is formed.

9. The method according to claim 8, wherein said first impurity is As+ ions, and said second impurity is B+ ions.

10. The method according to claim 9, wherein said B+ ions are doped to have a concentration peak in the vicinity of said insulating substrate.

11. The method according to claim 7, wherein said amorphous semiconductor layer is formed in a portion of said monocrystalline semiconductor layer except for the surface portion thereof.

12. The method according to claim 7, wherein said amorphous semiconductor layer is formed in the surface portion of said monocrystalline semiconductor layer.

13. The method according to one of claims 7 to 12, wherein said annealing is performed at a temperature of 700° to 1,000° C.

* * * * *